United States Patent
Yuasa et al.

(10) Patent No.: US 10,243,124 B2
(45) Date of Patent: Mar. 26, 2019

(54) LIGHT EMITTING DEVICE

(71) Applicant: NICHIA CORPORATION, Anan-shi (JP)

(72) Inventors: Taiki Yuasa, Tokushima (JP); Takeshi Kususe, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/831,392

(22) Filed: Dec. 5, 2017

(65) Prior Publication Data

US 2018/0182941 A1  Jun. 28, 2018

(30) Foreign Application Priority Data

Dec. 26, 2016 (JP) ................. 2016-250611
May 11, 2017 (JP) ................. 2017-094746

(51) Int. Cl.
| | |
|---|---|
| *H01L 33/60* | (2010.01) |
| *H01L 33/46* | (2010.01) |
| *H01L 33/50* | (2010.01) |
| *H01L 33/62* | (2010.01) |
| *H01L 33/56* | (2010.01) |
| *H01L 33/48* | (2010.01) |

(52) U.S. Cl.
CPC ............ *H01L 33/60* (2013.01); *H01L 33/46* (2013.01); *H01L 33/504* (2013.01); *H01L 33/486* (2013.01); *H01L 33/502* (2013.01); *H01L 33/56* (2013.01); *H01L 33/62* (2013.01); *H01L 2224/16245* (2013.01); *H01L 2933/0083* (2013.01)

(58) Field of Classification Search
None
See application file for complete search history.

(56) References Cited

U.S. PATENT DOCUMENTS 7,245,072 B2 * 7/2007 Ouderkirk ............... H01L 33/46
                                                        257/98
8,093,610 B2 * 1/2012 Wilm .................... H01L 33/50
                                                        257/103
(Continued)

FOREIGN PATENT DOCUMENTS

| JP | 2004-071726 | 3/2004 |
| JP | 2005-228996 | 8/2005 |

(Continued)

*Primary Examiner* — Joseph Schoenholtz
(74) *Attorney, Agent, or Firm* — Mori & Ward, LLP (57) ABSTRACT

A light emitting device includes a light emitting element having a light emitting surface from which the light emitting element is configured to emit a first light having a first peak emission wavelength in a wavelength range of 380 nm or longer and 430 nm or shorter. A light transform layer is disposed on the light emitting surface of the light emitting element to transform the first light to a second light having a second peak wavelength longer than the first peak wavelength. A reflecting film is provided on the light transform layer to reflect the first light and to transmit the second light. The reflecting film has a reflectivity of 40% or more in a reflection spectrum of the reflecting film with respect to a light having a wavelength of 380 nm or longer and 430 nm or shorter and an angle of incidence from 0° to 85°.

20 Claims, 7 Drawing Sheets

(56) References Cited

U.S. PATENT DOCUMENTS

| | | | | |
|---|---|---|---|---|
| 8,405,104 B2* | 3/2013 | Streubel | ............... | H01L 33/50 257/80 |
| 2004/0145895 A1* | 7/2004 | Ouderkirk | ............... | H01L 33/46 362/260 |
| 2006/0145172 A1* | 7/2006 | Su | ............... | H01L 33/58 257/98 |
| 2006/0208268 A1* | 9/2006 | Ueno | ............... | H01L 33/46 257/98 |
| 2010/0012959 A1* | 1/2010 | Wilm | ............... | H01L 33/44 257/98 |
| 2010/0084678 A1* | 4/2010 | Streubel | ............... | H01L 33/46 257/98 |
| 2011/0025190 A1* | 2/2011 | Jagt | ............... | H01L 33/58 313/499 |
| 2011/0031874 A1* | 2/2011 | Hosokawa | ............... | C09K 11/0883 313/503 |
| 2012/0228564 A1* | 9/2012 | Hashimoto | ............... | C08G 69/26 252/582 |
| 2014/0264412 A1* | 9/2014 | Yoon | ............... | H01L 33/504 257/98 |
| 2015/0085467 A1 | 3/2015 | Tsumori et al. | | |
| 2015/0243855 A1* | 8/2015 | Wilm | ............... | H01L 33/46 257/98 |
| 2018/0082985 A1* | 3/2018 | Kim | ............... | H01L 25/0753 |

FOREIGN PATENT DOCUMENTS

| | | |
|---|---|---|
| JP | 2007-184326 | 7/2007 |
| JP | 2007-184330 | 7/2007 |
| JP | 2009-182241 | 8/2009 |
| JP | 2011-243977 | 12/2011 |
| JP | 2015-088220 | 5/2015 |
| JP | 2015-088483 | 5/2015 |

* cited by examiner

FIG. 10 ical ideas of the present invention, and the
LIGHT EMITTING DEVICE

CROSS-REFERENCE TO RELATED APPLICATIONS

The present application claims priority under 35 U. S. C. § 119 to Japanese Patent Application No. 2016-250611, filed Dec. 26, 2016, and Japanese Patent Application No. 2017-094746, filed May 11, 2017. The contents of these applications are incorporated herein by reference in their entirety.

BACKGROUND OF THE INVENTION

Field of the Invention

The present invention relates to a light emitting device.

Discussion of the Background

A light emitting device including a light emitting diode (LED) has been widely used as a display, a warning lamp, an indicating lamp, and an illuminating lamp.

For example, a light has been know that forms a vehicle tale lamp and a vehicle brake lamp that emit red light by a blue light emitting diode that emits blue light and a fluorescent material that converts the light from the blue light emitting diode to red light (see, for example, Japanese Unexamined Patent Application Publication Nos. 2015-88220 and 2015-88483).

SUMMARY OF THE INVENTION

According to one aspect of the present invention, a light emitting device includes a light emitting element, a light transform layer, and a reflecting film. The light emitting element has a light emitting surface from which the light emitting element is configured to emit a first light having a first peak emission wavelength in a wavelength range of 380 nm or longer and 430 nm or shorter. The light transform layer is disposed on the light emitting surface of the light emitting element to transform the first light to a second light having a second peak wavelength longer than the first peak wavelength. The reflecting film is provided on the light emitting surface via the light transform layer to reflect the first light and to transmit the second light. The reflecting film has a reflectivity of 40% or more in a reflection spectrum of the reflecting film with respect to a light having a wavelength of 380 nm or longer and 430 nm or shorter and an angle of incidence from 0° to 85°.

According to another aspect of the present invention, a light emitting device includes a light emitting element, a light transform layer, and a reflecting film. The light emitting element is to emit a first light having a first peak emission wavelength in a wavelength range of 380 nm or longer and 430 nm or shorter. The light emitting element includes a first semiconductor layer, a second semiconductor layer, and an active layer. The second semiconductor layer is stacked on the first semiconductor layer in a stacking direction. The active layer is stacked between the first semiconductor layer and the second semiconductor layer in the stacking direction. The light transform layer is stacked on the light emitting element in the stacking direction to transform the first light to a second light having a second peak wavelength longer than the first peak wavelength. The reflecting film is stacked on the light transform layer in the stacking direction to reflect the first light and to transmit the second light. The reflecting film has a reflectivity of 40% or more with respect to a light having a wavelength in a range of 380 nm or longer and 430 nm or shorter and is emitted in a light emitting direction from a center of the active layer viewed in the stacking direction such that the light emitting direction and the stacking direction makes an angle ranging from −85° to +85°.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Hereinafter, light emitting devices according to embodiments are described with reference to the embodiments and examples. The present invention, however, is not limited to these embodiments and examples. The embodiments described below are to exemplify light emitting devices for embodying technical ideas of the present invention, and the present invention is not to be limited to the light emitting devices described below.

The relationship between names of colors and chromaticity coordinates, the relationship between wavelength ranges of light and names of monochromatic light, and the like are in conformity with JIS Z8110. Specifically, monochromatic light having a wavelength ranging from 380 nm to 410 is violet, monochromatic light having a wavelength ranging from 410 nm to 455 nm is blue-violet, monochromatic light having a wavelength ranging from 455 nm to 485 nm is blue, monochromatic light having a wavelength ranging from 485 nm to 495 nm is blue-green, monochromatic light having a wavelength ranging from 495 nm to 548 nm is green, monochromatic light having a wavelength ranging from 548 nm to 573 nm is yellow-green, monochromatic light having a wavelength ranging from 573 nm to 584 nm is yellow, monochromatic light having a wavelength ranging from 584 nm to 610 nm is yellow-red, and monochromatic light having a wavelength ranging from 610 nm to 780 nm is red.

In the light emitting devices and a method of manufacturing a light emitting device according to the embodiments, "up," "down," "left," "right," and the like vary according to the situation. In the present specification, "up," "down," and the like indicate a relative position among constituents in a drawing that is referred to for description and are not intended to indicate an absolute position unless otherwise specified.

In the present specification, "on" of, for example, "on" a light emitting element, "on" a fluorescent material layer, and "on" a reflecting film does not restrictively refer to a form in which another member is in contact with these constituents, and may refer to a form in which another member is not in contact with these constituents but is on these constituents with another additional member disposed between the other member and these constituents. For example, a phrase "something is disposed on a member A," i.e., "something is disposed on a light emitting surface of a light emitting element 20" includes cases in which something is provided in contact with the member A and in which something is provided on the member A with another layer interposed between something and the member A.

In the present specification, the numerical range represented by "from" and "to" indicates a range including a value following "from" as the minimum value and a value following "to" as the maximum value. When a composition contains a plurality of substances corresponding to a component, the content of the component in the composition means a total amount of the plurality of substances present in the composition unless otherwise specified.

Figure 1:
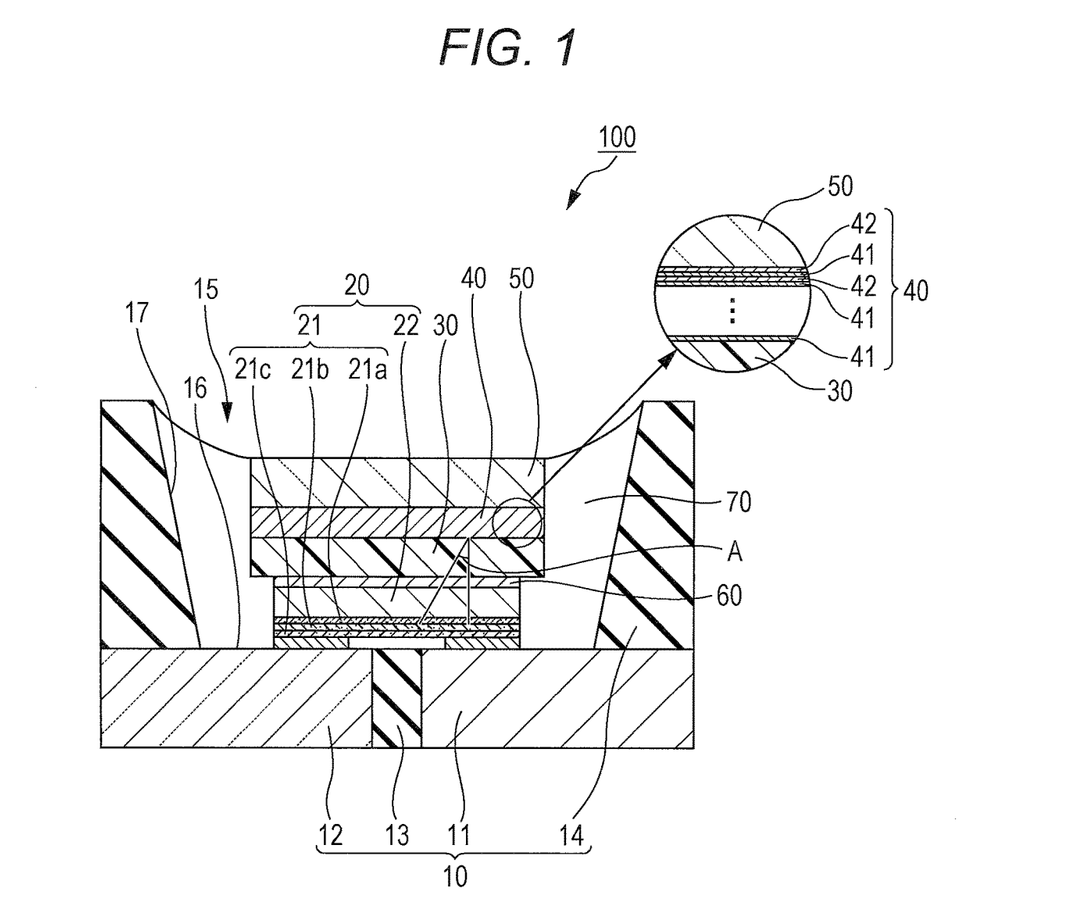
FIG. 1 is a schematic sectional view illustrating one example of a light emitting device according to an embodiment.
Figure 2:
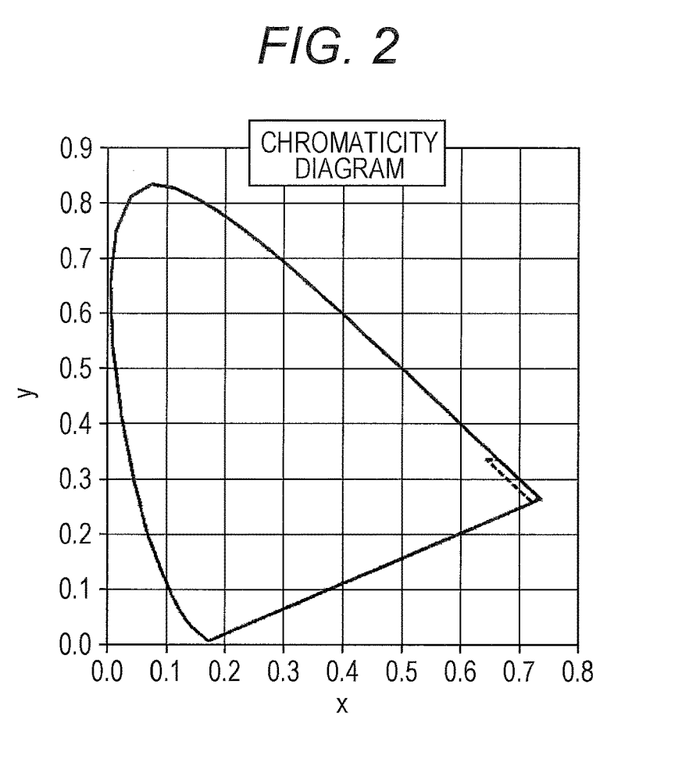
FIG. 2 is a schematic chromaticity diagram illustrating chromaticity coordinates (CIE1931) of light emitted by the light emitting device according to the first embodiment.

Hereinafter, a light emitting device according to a present first embodiment is described with reference to drawings. FIG. 1 is a schematic sectional view illustrating one example of the light emitting devices according to the embodiments. FIG. 2 is a schematic chromaticity diagram illustrating chromaticity coordinates (CIE1931) of light emitted by the light emitting device according to the first embodiment. An angle of incidence A of first light to a reflecting film indicates the angle of incidence A illustrated in FIG. 1. The center of an active layer in a plan view of a light emitting element is to be a reference point unless otherwise specified. Assuming that the first light is output from the center of the active layer, the angle of incidence A is defined.

A light emitting device 100 includes a base 10, a light emitting element 20 disposed on the base 10, a fluorescent material layer (a light transform layer) 30 disposed on the light emitting element 20, and a reflecting film 40 provided on the fluorescent material layer 30. The light emitting device 100 further includes a light-transmissive member 50 provided on the reflecting film 40. The base 10 includes a first lead 11, a second lead 12, a fixing portion 13 disposed between the first lead 11 and the second lead 12, and a side wall 14 provided on each of the first lead 11 and the second lead 12. The base 10 has a recess portion 15 formed therein, the first lead 11, the second lead 12, and the fixing portion 13 are disposed on an inner bottom surface 16 of the recess portion 15, and the side wall 14 is disposed on an inner side surface 17 of the recess portion 15. The light emitting element 20 is disposed on the inner bottom surface 16 of the recess portion 15 of the base 10, and a resin 70 is disposed in the recess portion 15 of the base 10 so as to be in contact with the light-transmissive member 50. The light emitting element 20 may be disposed on the inner bottom surface 16 of the recess portion 15 with use of a die bonding material such as a metal (e.g., gold and solder) or a resin (e.g., an epoxy resin). With the inner bottom surface 16 of the recess portion 15 of the base 10 set as a reference level, an uppermost surface of the recess portion 15 of the base 10 is preferable to be positioned higher than a surface of the light-transmissive member 50. This configuration can prevent detachment of the light-transmissive member 50.

The light emitting element 20 emits first light having a peak emission wavelength in a wavelength range of 380 nm or longer and 430 nm or shorter. The light emitting element 20 includes a semiconductor stacked-layer body 21 and a substrate 22. The semiconductor stacked-layer body 21 includes a first semiconductor layer 21a, an active layer 21b, and a second semiconductor layer 21c stacked in this order. The light emitting element 20 has the light emitting surface on either a substrate 22 side or a semiconductor stacked-layer body 21 side.

With the maximum intensity of the peak emission wavelength defined as 1, the light emitting element 20 preferably has a relative intensity of 0.3 or less for light having a wavelength of 450 nm and more preferably has a relative intensity of 0.1 or less for light having a wavelength of 450 nm. This configuration can inhibit light having a wavelength of in the vicinity of 450 nm from being exteriorly released.

The fluorescent material layer 30 contains a fluorescent material that is excited by the first light and emits second light having a wavelength longer than the wavelength of the first light. The fluorescent material layer 30 may be formed of only a fluorescent material. Alternatively, the fluorescent material may be solidified by an organic material such as a resin or by an inorganic material such as ceramics. The fluorescent material layer 30 is excellent in heat resistance when obtained by hardening particles of the fluorescent material through firing. Particles of the fluorescent material dispersed in, for example, an epoxy resin or a silicone resin enables easy formation of the fluorescent material layer 30. The fluorescent material layer 30 is also excellent in heat resistance that is obtained by hardening particles of the fluorescent material and particles of ceramics through firing. The material and method are to be appropriately selected according to the purpose of use and use application of the light emitting device.

The fluorescent material contained in the fluorescent material layer 30 has a peak emission wavelength in a wavelength range of preferably 550 nm or longer and 780 nm or shorter, more preferably 584 nm or longer and 680 nm or shorter. This is because the fluorescent material having a peak emission wavelength in these ranges can enhance light emission brightness. In addition, because the fluorescent material having a peak emission wavelength in these ranges facilitates visual observation of red light emission.

The reflecting film 40 has a property of reflecting the first light and transmitting the second light. In a reflection spectrum of the reflecting film 40, the reflecting film 40 has a reflectivity of 40% or more, preferably 45% or more for light having a wavelength of 380 nm or longer and 430 nm or shorter at an angle of incidence A of the first light to the reflecting film 40 of from 0° to 85°. The reflecting film has a reflectivity of preferably 90% or more, more preferably 95% or more for light having a wavelength of 380 nm or longer and 430 nm or shorter at an angle of incidence A of the first light to the reflecting film 40 of from 0° to 45°. The reflecting film has a reflectivity of preferably 90% or more, more preferably 95% or more for light having a wavelength of 380 nm or longer and 530 nm or shorter at an angle of incidence A between the first light and the reflecting film 40 of 0°.

This configuration enables provision of the light emitting device 100 that can inhibit the first light from transmitting even when the angle of incidence A between the first light and the reflecting film 40 is not vertical (0°) and that can reduce color shifting caused by visual observation at different angles.

With the center of the active layer 21 in a plan view of the light emitting element 20 set as a reference point, the reflecting film 40 has a reflectivity of 40% or more for light having a wavelength of 380 nm or longer and 430 nm or shorter in an angle range of the reference point toward the reflecting film 40 of from −85° to +85°. This angle is the same angle as the angle of incidence A.

The light-transmissive member 50 mainly transmits the second light. For the light-transmissive member 50, there can be used an inorganic material such as ceramics or glass, and an organic material such as a resin. For example, there can be used a transparent glass plate whose surface in contact with the reflecting film 40 is flat.

The fluorescent material layer 30 disposed on the light emitting element 20 may be disposed with an adhesive agent layer 60 interposed between the light emitting element and the fluorescent material layer. The adhesive agent layer 60 is preferable to be light-transmissive. Use of the adhesive agent layer 60 enables easy disposition of the fluorescent material layer 30 on the light emitting element 20. The fluorescent material layer 30 disposed on the light emitting element 20 may directly be bonded without an adhesive agent interposed between the light emitting element and the fluorescent material layer. Direct bonding of the fluorescent material layer 30 to the light emitting element 20 enables heat generated in the fluorescent material layer 30 to be released through the light emitting element 20.

The reflecting film 40 can be used alone but can also be formed on the light-transmissive member 50 by, for example, printing or coating. Use of a high-strength member for the light-transmissive member 50 enables easy provision of the reflecting film 40. In addition, the reflecting film 40 can also be formed on the fluorescent material layer 30 by, for example, printing or coating.

The resin 70 disposed on the inner bottom surface 16 of the recess portion 15 may be disposed on a side surface of the light-transmissive member 50 except an upper surface of the light-transmissive member 50. Alternatively, the resin 70 may be disposed not only on the side surface of the light-transmissive member 50 but also so as to cover the light emitting element 20, the fluorescent material layer 30, and the reflecting film 40. The resin 70 disposed to reflect both the first light from the light emitting element 20 and the second light from the fluorescent material layer 30.

The resin 70 preferably contains at least one light diffusing material selected from the group consisting of zirconium oxide, yttrium oxide, aluminum oxide, aluminum hydroxide, barium carbonate, barium sulfate, magnesium oxide, and magnesium carbonate. Thanks to the light diffusing material, the first light from the light emitting element 20 that has irradiated the resin 70 containing the light diffusing material can return toward the fluorescent material layer 30, so that light emission efficiency of the second light from the fluorescent material layer 30 can be enhanced. Alternatively, the resin 70 may contain titanium oxide. Titanium oxide does not reflect and absorbs light having a wavelength shorter than 420 nm, but efficiently reflects light having a wavelength longer than 420 nm. Therefore, the resin 70 can contain titanium oxide when the light emitting element 20 is used that has a peak emission wavelength in a wavelength range from 420 nm to 430 nm.

This configuration allows the light emitting device 100 to output light having substantially an equal light emission spectrum to the light emission spectrum of the second light emitted by the fluorescent material layer 30.

The light emitting element 20 includes a pair of positive and negative electrodes on a same surface side thereof, is face-down mounted, and is electrically connected to the first lead 11 and the second lead 12 with an electrically conductive bonding member. The light emitting element can be face-up mounted instead of being face-down mounted. When face-up mounted, the light emitting element may be connected to the first lead 11 and the second lead 12 with wire in place of the electrically conductive bonding member.

The reflecting film 40 is provided on the fluorescent material layer 30, reflects the first light emitted by the light emitting element 20, and transmits the second light emitted by the fluorescent material layer 30. The reflecting film 40 can be formed of, for example, a dielectric multi-layer film obtained by alternately stacking a first dielectric layer 41 and a second dielectric layer 42 that have different refractive indexes. The thickness of the first dielectric layer 41 and the thickness of the second dielectric layer 42 are set according to a first refractive index of the first dielectric layer 41 and a second refractive index of the second dielectric layer 42, respectively, so that the dielectric multi-layer film can be configured to reflect the first light emitted by the light emitting element 20 and transmit the second light emitted by the fluorescent material layer 30.

In the light emitting device 100, the light emitting element 20 and the fluorescent material layer 30 are covered with the resin 70 and the reflecting film 40, so that the second light emitted by the fluorescent material layer 30 is output through the reflecting film 40 but the first light emitted by the light emitting element 20 is reflected on the resin 70 and the reflecting film 40 and returned toward the fluorescent material layer 30 to excite a fluorescent material, thus enhancing light emission efficiency. This configuration allows reduction of the first light exteriorly released from the light emitting device 100, making the light exteriorly released from the light emitting device 100 substantially only the second light from the fluorescent material layer 30, so that color shifting can be prevented that occurs in a vertical direction with respect to the semiconductor stacked-layer body 21. A part of the first light, however, transmits when the incidence of the first light to the reflecting film 40 is not vertical.

In the light emitting device 100, when the dielectric multi-layer film is used as the reflecting film 40, almost all the light vertically (0°) incident to the dielectric multi-layer film is reflected, but a part of the light that is not vertically incident transmits through the dielectric multi-layer film. In order to inhibit the light that is not vertically incident from being exteriorly output, it is effective to reduce the quantity of the first light from the light emitting element 20 that enters into the dielectric multi-layer film by increasing the thickness of the fluorescent material layer 30, that is, to make a fluorescent material absorb much of the first light from the light emitting element 20 and excited by the first light before the first light reaches the dielectric multi-layer film. Increasing the thickness of the fluorescent material layer 30, however, decreases light emission intensity, and therefore it is preferable to increase the light emission intensity by thinning the fluorescent material layer 30 up to a thickness at which the quantity of the first light emitted by the light emitting element 20 and exteriorly output is in an acceptable range. Specifically, with the maximum intensity defined as 1 in a light emission spectrum of the light emitting device 100, the light emitting device preferably has a relative intensity of 0.3 or less for light having a wavelength of 450 nm.

The light emitting device 100 emits light in a range surrounded by a quadrangle formed by connecting four points (x=0.645, y=0.335), (x=0.665, y=0.335), (x=0.735, y=0.265), and (x=0.721, y=0.259) in an xy chromaticity coordinate system of a CIE1931 chromaticity diagram. Such a configuration enables provision of the light emitting device that emits predetermined red light and reduces color shifting caused by visual observation at different angles.

The fluorescent material contained in the fluorescent material layer 30 is preferably at least one selected from fluorescent materials $(Sr,Ca)AlSiN_3$:Eu, $CaAlSiN_3$:Eu, and $K_2SiF_6$:Mn. The fluorescent materials may be combined. This configuration enables provision of the light emitting device that emits predetermined red light and reduces color shifting caused by visual observation at different angles.

The light emitting device 100 may be, for example, a shell type, a surface mounting type, or a chip type as long as the light-transmissive member 50 except the uppermost surface thereof is covered with the resin 70. Generally, the shell type light emitting device refers to a light emitting device in which a resin constituting an outer surface is formed into a shape of a shell type. Such a light emitting device includes, for example, a lead frame having a cup on one side thereof, a light emitting element disposed in the cup, and a sealing resin covering the light emitting element and a part of the lead frame. The surface mounting type light emitting device refers to a light emitting device obtained by mounting a light emitting element in a recessed storage portion and filling the light emitting element with a resin. As a material for the storage portion, exemplified are a thermoplastic resin, a thermosetting resin, ceramics, a metal or the like. The chip type light emitting device is a light emitting device that has, in contrast with the surface mounting type light emitting device, no recessed storage portion, and is obtained by directly forming a fluorescent material on a light emitting element and fixing, for example, a side surface of the light emitting element with a resin. In the chip type light emitting device, a layer containing a fluorescent material can be formed into a lens shape as well as a flat plate shape.

Here, an example of the surface mounting type light emitting device is described in detail.

Base

For the fixing portion 13 and the side wall 14 of the base 10, there can be used, for example, a resin such as a thermoplastic resin or a thermosetting resin, an inorganic material such as ceramics or glass, and a metal that has been subjected to, for example, an insulation process.

It is preferable that the base 10 of the surface mounting type light emitting device have an insulating property and be less likely to transmit light. As a material for the base 10, there can be exemplified ceramics such as alumina and aluminum nitride, and a resin such as a phenolic resin, an epoxy resin, a polyimide resin, a BT resin, or a polyphthalamide resin. When a resin is used as the material, an inorganic filler such as a glass fiber, silicon oxide, titanium oxide, or alumina may be mixed as necessary. Among these examples, ceramics are more preferable for their high heat releasing effect.

The base 10 includes the first lead 11, the second lead 12, and the fixing portion 13. As the base 10, there is mainly exemplified a top view type that releases light in a substantially vertical direction to a mounting surface and a side view type that releases light in a substantially parallel direction to a mounting surface. The present case is applicable to both the types. The first lead 11 and the second lead 12 are formed of a plate-shaped metal. Here, the first lead 11 and the second lead 12 do not exteriorly protrude from the fixing portion 13 when viewed from an opening direction of the recess portion 15. The first lead and the second lead, however, can also take a configuration of exteriorly protruding from the fixing portion 13.

A material that constitutes the first lead 11 and the second lead 12 is preferably, for example, a metal having a thermal conductivity of about 200 W/(m·K) or more or having relatively large mechanical strength, or a material that is easily processed by a punch press, etching, or the like. Specific examples of the material include metals such as copper, aluminum, gold, silver, tungsten, iron, and nickel, and alloys such as an iron-nickel alloy and phosphor bronze. Alternatively, a surface of a base material of the first lead 11 and the second lead 12 may be covered with, for example, silver, aluminum, or gold having a higher light reflectivity than the light reflectivity of the base material.

Light Emitting Element

The light emitting element 20 is for exciting a fluorescent material contained in the fluorescent material layer 30. As the light emitting element 20, there can be used, for example, a light emitting diode (LED) chip or a laser diode (LD) chip. Especially, an LED chip is preferably used. With a light emitting diode chip used as the light emitting element 20, the light from the light emitting element 20 can easily broaden to efficiently excite the fluorescent material. As the light emitting element 20, there can be used, for example, a light emitting diode chip that includes a nitride semiconductor and emits blue light. Here, the light emitting diode chip that emits blue light refers to a light emitting diode chip having a peak emission wavelength in a range of 380 nm or longer and 430 nm or shorter. The light emitting element 20 includes the semiconductor stacked-layer body 21 and the substrate 22. The semiconductor stacked-layer body 21 may be stacked on a substrate or may be attached to a substrate different from a growth substrate.

The nitride semiconductor referred to herein is a semiconductor represented by the general formula $In_XAl_YGa_{1-X-Y}N$ ($0 \leq X$, $0 \leq Y$, $X+Y \leq 1$), and the light emission wavelength can variously be selected by the composition of a semiconductor layer or the mixed crystallinity of the semiconductor layer. The light emitting element 20 including the nitride semiconductor includes the substrate 22 that allows growth of the nitride semiconductor, such as sapphire, and the semiconductor stacked-layer body 21 provided on the substrate 22.

In the light emitting element 20, the semiconductor stacked-layer body 21 includes the first semiconductor layer 21a, the active layer 21b, and the second semiconductor layer 21c. The first semiconductor layer 21a and the second semiconductor layer 21c have different polarities. For example, a p-type semiconductor layer and an n-type semiconductor layer are used for the first semiconductor layer 21a and the second semiconductor layer 21c, respectively, and a p-electrode is connected to the p-type semiconductor layer and an n-electrode is connected to the n-type semiconductor layer. The p-electrode and the n-electrode are preferably formed on a surface of the same side of the light emitting element 20 and flip-chip mounted on the first lead 11 and the second lead 12. This configuration makes an upper surface of the light emitting element 20 a flat surface, which makes it possible to closely dispose the fluorescent material layer 30 above the light emitting element 20. The light emitting element 20 includes the substrate 22. The substrate 22, however, may be removed during or after mounting to allow the fluorescent material layer 30 to be bonded onto the semiconductor stacked-layer body 21 directly or with the adhesive agent layer 60 interposed between the semiconductor stacked-layer body and the fluorescent material layer.

Fluorescent Material Layer

The fluorescent material layer 30 absorbs the first light from the light emitting element 20 and generates light having a different wavelength.

The fluorescent material layer 30 is formed by, for example, printing a light-transmissive resin paste containing particles of the fluorescent material on a surface of the light-transmissive member with the reflecting film 40 interposed between the fluorescent material layer and the light-transmissive member. The fluorescent material layer 30 may be formed of at least one layer. The fluorescent material layer 30 may contain a diffusing agent as necessary.

Here, at least one fluorescent material or fluorescent materials in combination are used that absorb the light from the light emitting element 20 having a peak emission wavelength in a wavelength range of 380 nm or longer and 430 nm or shorter and emit light having a peak emission wavelength in a wavelength range of 550 nm or longer and 780 nm or shorter. Here, the fluorescent material mainly emits red light as a light emission color. The fluorescent material only has to emit light having a peak emission wavelength in a wavelength range of 550 nm or longer and 780 nm or shorter, and is not limited to one having a light emission spectrum of 550 nm or longer and 780 nm or shorter. Particularly, the fluorescent material has a peak emission wavelength in a wavelength range of preferably 610 nm or longer and 680 nm or shorter, more preferably 610 nm or longer and 650 nm or shorter. This is because the visibility of light is peak at about 555 nm and decreases as the wavelength is longer than 555 nm, and therefore it is preferable to use, for improving the brightness, the fluorescent material having a peak emission wavelength in a wavelength range of 610 nm or longer and 650 nm or shorter that is relatively high in visibility in a red color range.

The average particle size of the fluorescent material is not particularly limited and can appropriately be selected according to the purpose or the like. The average particle size of the fluorescent material is preferably 1 μm or more and 20 μm or less, more preferably 5 μm or more and 15 μm or less, from the viewpoint of light emission efficiency.

When the entire volume of particles of the fluorescent material contained in a resin is the same, reduction of the particle size increases the surface area of the particles, making light emitted by a particle of the fluorescent material likely to be scattered by another particle of the fluorescent material to decrease light extraction efficiency. On the other hand, an increase in particle size decreases the scattering to enhance the light extraction efficiency, but reduces the surface area of particles to decrease the quantity of light emitted by the fluorescent material, increasing the quantity of light whose wavelength is not converted. The light whose wavelength has not been converted and reached the reflecting film 40 is returned toward the fluorescent material layer 30 again by the reflecting film, so that increasing the particle size of particles of the fluorescent material enables efficient wavelength conversion of the first light from the light emitting element 20 while reducing the scattering on surfaces of the particles. Accordingly, in the light emitting device 100, increasing the particle size of particles of the fluorescent material enables efficient wavelength conversion of the first light from the light emitting element 20 and improvement in light extraction efficiency.

The average particle size of particles of the fluorescent material referred to in the present specification means the average particle size of secondary particles formed through aggregation of primary particles. The average particle size (median size) of secondary particles can be measured by, for example, a laser diffraction particle size distribution measuring apparatus (product name: MASTER SIZER 3000 manufactured by Malvern Instruments Ltd.).

The fluorescent material layer 30 has a thickness ranging preferably from 30 μm to 150 μm, more preferably from 50 μm to 120 μm. This configuration can reduce the quantity of the second light lost through scattering in the fluorescent material layer 30 and increase the quantity of the second light output from the fluorescent material layer 30.

As the fluorescent material, there can be used, for example, a nitride-based fluorescent material, an oxide fluorescent material, a fluoride fluorescent material, and a sulfide fluorescent material.

The nitride-based fluorescent material is a fluorescent material that is activated with at least one rare-earth element selected from the group consisting of Y, La, Ce, Pr, Nd, Sm, Eu, Gd, Tb, Dy, Ho, Er, and Lu, and that contains at least one group II element selected from the group consisting of Be, Mg, Ca, Sr, Ba, and Zn, at least one group IV element selected from the group consisting of C, Si, Ge, Sn, Ti, Zr, and Hf, and N. The composition of this nitride-based fluorescent material may also include O.

Specific examples of the nitride-based fluorescent material include those represented by the general formulae $L_XM_YN_{(2/3)X+(4/3)Y)}:R$ and $L_XM_YO_ZN_{((2/3)X+(4/3)Y-(2/3)Z)}:R$ (L is at least one group II element selected from the group consisting of Be, Mg, Ca, Sr, Ba, and Zn; M is at least one group IV element selected from the group consisting of C, Si, Ge, Sn, Ti, Zr, and Hf; R is at least one rare-earth element selected from the group consisting of Y, La, Ce, Pr, Nd, Sm, Eu, Gd, Tb, Dy, Ho, Er, and Lu; and X, Y, and Z satisfy $0.5 \leq X \leq 3$, $1.5 \leq Y \leq 8$, and $0 < Z \leq 3$, respectively).

More specific examples of the nitride-based fluorescent material include a SCASN-based fluorescent material represented by $(Sr,Ca)AlSiN_3:Eu$ and a CASN-based fluorescent material represented by $CaAlSiN_3:Eu$.

Apart from the nitride-based fluorescent material, there can be used, for example, a $KSF(K_2SiF_6:Mn)$-based fluorescent material and a sulfide-based fluorescent material.

The example so far described is for forming the fluorescent material layer 30 by printing a light-transmissive resin paste containing particles of the fluorescent material. The fluorescent material layer 30, however, may be formed by forming into a film a light-transmissive material, such as glass or an inorganic material, that contains the fluorescent material. In addition, although the form has been described in which the fluorescent material layer 30 is in direct contact with a surface of the reflecting film 40, the fluorescent material layer 30 does not necessarily need to be in direct contact with a surface of the reflecting film 40 but may be bonded to a surface of the reflecting film with another member such as an adhesive agent interposed between the fluorescent material layer and the reflecting film. For example, a plate-shaped fluorescent material may be formed by crimping, fusion, sintering, adhesion with an organic adhesive agent, or adhesion with an inorganic adhesive agent such as low melting temperature glass.

Reflecting Film

As the reflecting film 40, it is preferable to use a dielectric multi-layer film having high selectivity. The high selectivity here refers to high reflectivity in a reflective wavelength band, high transmissivity in a transmissive wavelength band, and a steep change in reflectivity or transmissivity between the reflective wavelength band and the transmissive wavelength band.

The dielectric multi-layer film is a reflecting film obtained by alternately and cyclically forming the two layers, the first dielectric layer 41 and the second dielectric layer 42 that have different refractive indexes, each at such a thickness as to give a phase difference of $\lambda/4$. Here, $\lambda$ is a peak wavelength in a wavelength range intended to be reflected, and an in-medium wavelength in each dielectric material. Logically, this dielectric multi-layer film is known to give a higher reflectivity along with an increase of difference in refractive index between the two layers, the first dielectric layer 41 and the second dielectric layer 42, or along with an increase in the number of alternate formation cycles. However, a too large difference in refractive index between the two layers, the first dielectric layer 41 and the second dielectric layer 42 or a too large number of cycles causes a sharp reduction in reflectivity on both sides of a reflection peak wavelength $\lambda$ (steep wavelength dependence) or increases the wavelength dependence of the reflectivity, making it difficult to stably obtain a desired reflectivity in a desired wavelength range. Therefore, the dielectric multi-layer film is appropriately set in terms of the refractive indexes of the first dielectric layer 41 made from a dielectric material having a high refractive index and the second dielectric layer 42 made from a dielectric material having a low refractive index, and the difference in refractive index between the layers, and the number of alternate formation cycles, so that a desired reflectivity in a desired wavelength range can stably be obtained.

Specifically, a first refractive index of the first dielectric layer 41 having a high refractive index is set to a range, for example, from 1.5 to 3.0, preferably from 2.0 to 2.6. A second refractive index of the second dielectric layer 42 having a low refractive index is set to a range, for example, from 1.0 to 1.8, preferably from 1.2 to 1.6. The number of alternate formation cycles of the first dielectric layer 41 and the second dielectric layer 42 is set to a range, for example, from 1 to 20, preferably from 1 to 5. The difference between the first refractive index and the second refractive index is preferably 0.3 or more, more preferably 0.5 or more, further preferably 0.7 or more.

The dielectric material that constitutes the first dielectric layer 41 can be selected from, for example, $TiO_2$, $Nb_2O_5$, $Ta_2O_5$, and $Zr_2O_5$. The dielectric material that constitutes the second dielectric layer 42 can be constituted by a material selected from, for example, $SiO_2$, $Al_2O_3$, and SiON.

Light-Transmissive Member

The light-transmissive member 50 has on one surface thereof the reflecting film 40 and the fluorescent material layer 30 provided, and supports the reflecting film 40 and the fluorescent material layer 30. For the light-transmissive member 50, there can be used a plate-shaped body made from a light-transmissive material such as glass or a resin. The glass can be selected from, for example, borosilicate glass and quartz glass. The resin can be selected from, for example, a silicone resin and an epoxy resin. The light-transmissive member 50 can have any thickness that does not decrease the mechanical strength in manufacturing steps and imparts sufficient mechanical strength to the fluorescent material layer 30. The light-transmissive member 50 may contain a diffusing agent. As the diffusing agent, there can be used, for example, titanium oxide, barium titanate, aluminum oxide, and silicon oxide. The upper surface of the light-transmissive member 50 is not limited to a flat surface but may have fine protrusions and recesses, the upper surface being to be a light emitting surface, i.e., a surface opposite from the surface on which are provided the reflecting film 40 and the fluorescent material layer 30. The light emitting surface having protrusions and recesses can scatter the light output from the light emitting surface to reduce unevenness in brightness and color.

Adhesive Agent Layer

The adhesive agent layer 60 adhesively attaches the light emitting element 20 to the fluorescent material layer 30. The adhesive agent layer 60 is preferable to be made from a material capable of guiding the light output from the light emitting element 20 to the fluorescent material layer 30 with the least attenuation of the light. Specific examples of the material include organic resins such as an epoxy resin, a silicone resin, a phenolic resin, and a polyimide resin, and a silicone resin is preferable. The adhesive agent layer 60 is preferable when the thickness thereof is thinner. This is because the adhesive agent layer that is thin can reduce loss of light that transmits through the adhesive agent layer and improve a heat releasing property to enhance the intensity of the light output from the light emitting device.

The adhesive agent layer 60 may be present not only between the light emitting element 20 and the fluorescent material layer 30 but also on a side surface of the light emitting element 20. When the fluorescent material layer 30 contains a silicone resin as a binder, the adhesive agent of the adhesive agent layer 60 is preferable to also contain a silicone resin. This configuration can reduce the difference in refractive index between the fluorescent material layer 30 and the adhesive agent layer 60 to increase the light that enters from the adhesive agent layer 60 to the fluorescent material layer 30.

Resin

As a material for the resin 70, it is preferable to use an insulating material. In order to secure a certain degree of strength, for example, a thermosetting resin or a thermoplastic resin can be used. More specific examples of the material include a phenolic resin, an epoxy resin, a BT resin, PPA, and a silicone resin. These resins to be base materials can be used with a reflecting member that is less likely to absorb the light from the light emitting element 20 and has a large difference in refractive index from the refractive index of the resins to be base materials. Specifically, it is possible to efficiently reflect light by dispersing at least one light diffusing material selected from the group consisting of zirconium oxide, yttrium oxide, aluminum oxide, aluminum hydroxide, barium carbonate, barium sulfate, magnesium oxide, and magnesium carbonate.

Second Embodiment

Figure 10:
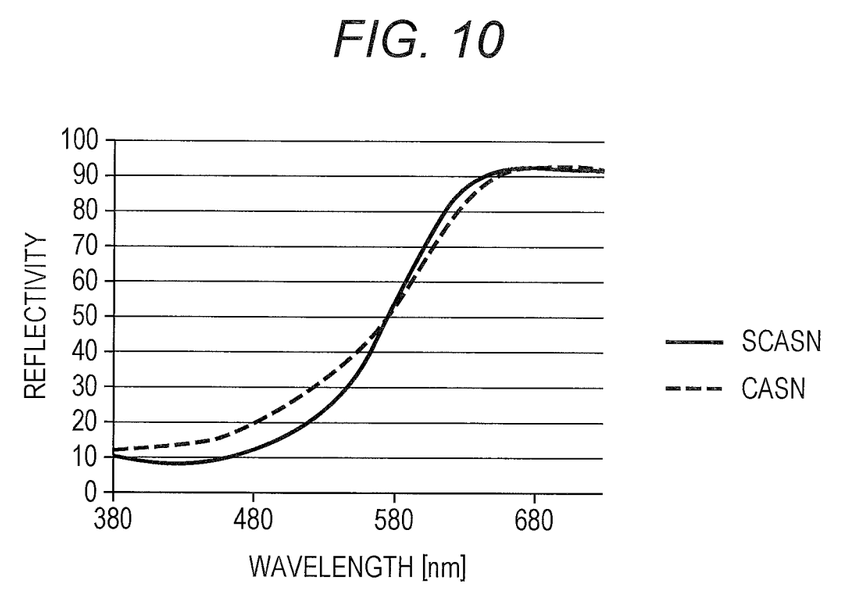
FIG. 10 is a schematic spectrum diagram illustrating reflectivity of powders of fluorescent materials (Sr,Ca)AlSiN$_3$:Eu and CaAlSiN$_3$:Eu.

A light emitting device according to a second embodiment is described with reference to a drawing. FIG. 1 is a schematic sectional view illustrating one example of the light emitting devices according to the embodiments. FIG. 10 is a schematic spectrum diagram illustrating reflectivity of powders of fluorescent materials $(Sr,Ca)AlSiN_3:Eu$ and $CaAlSiN_3:Eu$. The second embodiment is almost the same as the first embodiment except the form of the fluorescent material layer 30, in which the fluorescent material layer includes a plurality of stacked layers. Description is sometimes omitted for parts that overlap with the first embodiment.

The fluorescent material layer 30 has a fluorescent material $CaAlSiN_3$:Eu layer disposed on a near side to the light emitting element 20 and a fluorescent material $(Sr,Ca)AlSiN_3$:Eu layer disposed on a far side from the light emitting element. The disposition of the layers in this order can enhance the light emission efficiency in comparison with a fluorescent material layer having the fluorescent materials $CaAlSiN_3$:Eu and $(Sr,Ca)AlSiN_3$:Eu dispersed therein to provide a bright light emitting device. This is considered to be because the fluorescent material $CaAlSiN_3$:Eu has a higher reflectivity than the reflectivity of the fluorescent material $(Sr,Ca)AlSiN_3$:Eu in the vicinity of the light emission wavelength of the light emitting element 20 ranging, for example, from 440 nm to 480 nm, enabling returning again to the fluorescent material $CaAlSiN_3$:Eu layer, the blue light from the light emitting element 20 that is reflected on an interface between the fluorescent material $CaAlSiN_3$:Eu layer and the fluorescent material $(Sr,Ca)AlSiN_3$:Eu layer, to thus amplify the light emitted by the fluorescent material $CaAlSiN_3$:Eu. The fluorescent material $(Sr,Ca)AlSiN_3$:Eu, which has a lower reflectivity and a higher light absorption than the reflectivity and the light absorption of the fluorescent material $CaAlSiN_3$:Eu in the vicinity of the light emission wavelength of the light emitting element 20, can be disposed as the upper layer to reduce the blue light that transmits through the fluorescent material $(Sr,Ca)AlSiN_3$:Eu layer.

In a method of manufacturing the light emitting device 100, on the light-transmissive member 50 is formed the reflecting film 40 that is a dielectric multi-layer film including alternately stacked dielectric layers having different refractive indexes, and on the reflecting film 40 is formed the fluorescent material layer 30 including the fluorescent material $(Sr,Ca)AlSiN_3$:Eu layer and the fluorescent material $CaAlSiN_3$:Eu layer in this order. The thickness of the fluorescent material $CaAlSiN_3$:Eu layer and the fluorescent material $(Sr,Ca)AlSiN_3$:Eu layer is not particularly limited and is, for example, about 100 µm.

The light emitting element 20 is disposed in advance on the base 10. The adhesive agent layer 60 is applied to an upper surface of the light emitting element 20 and the fluorescent material layer 30 is disposed on the light emitting element 20 so that the light emitting surface of the light emitting element 20 is opposite to the fluorescent material layer 30.

As described above, the light emitting device 100 can easily be manufactured.

EXAMPLES

Figure 3:
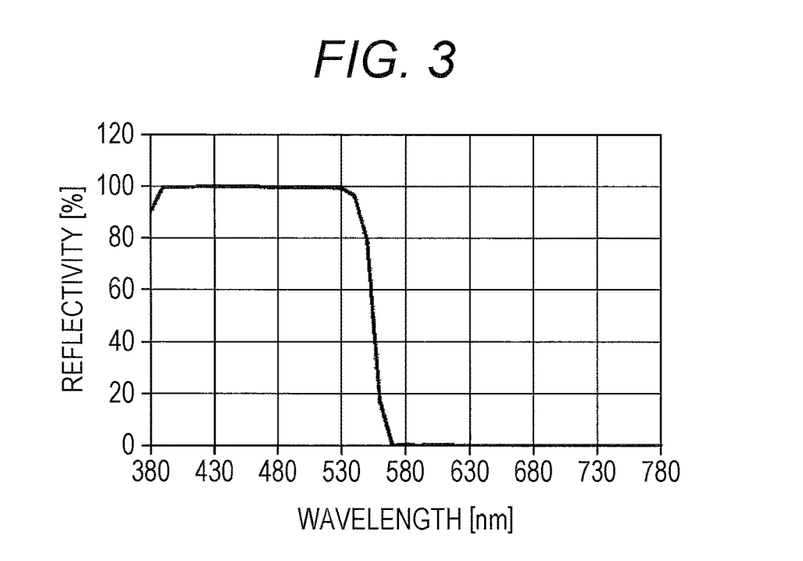
FIG. 3 is a schematic diagram illustrating reflectivity of a reflecting film for wavelengths of normal incident light (an angle of incidence of 0°) in a light emitting device according to Example 1.
Figure 4:
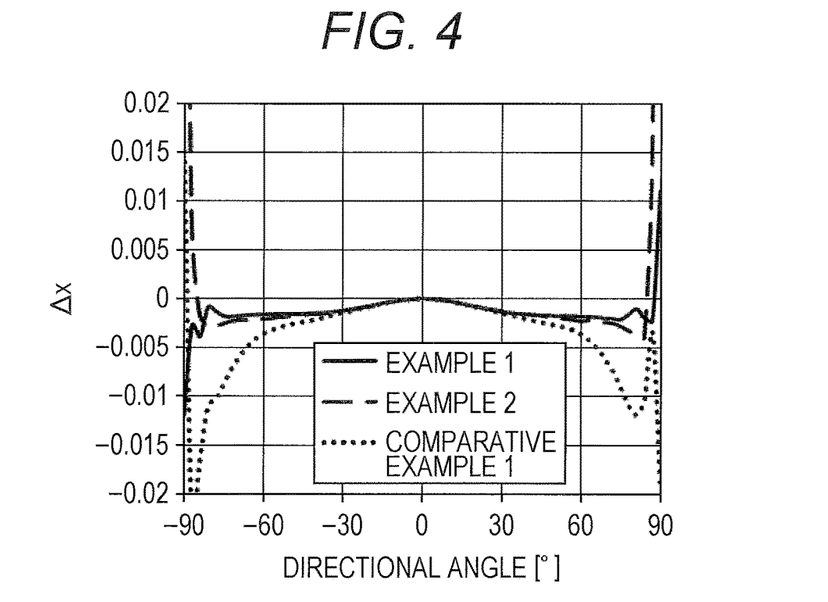
FIG. 4 is a schematic diagram illustrating a shift of chromaticity coordinates x relative to directional angles in light emitting devices of Examples 1 and 2 and Comparative Example 1.
Figure 5:
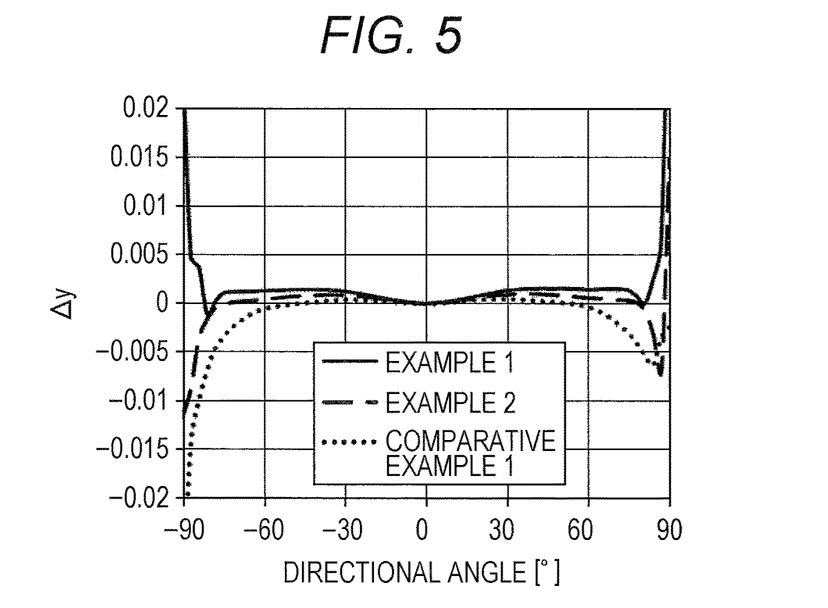
FIG. 5 is a schematic diagram illustrating a shift of chromaticity coordinates y relative to directional angles in the light emitting devices of Examples 1 and 2 and Comparative Example 1.
Figure 6:
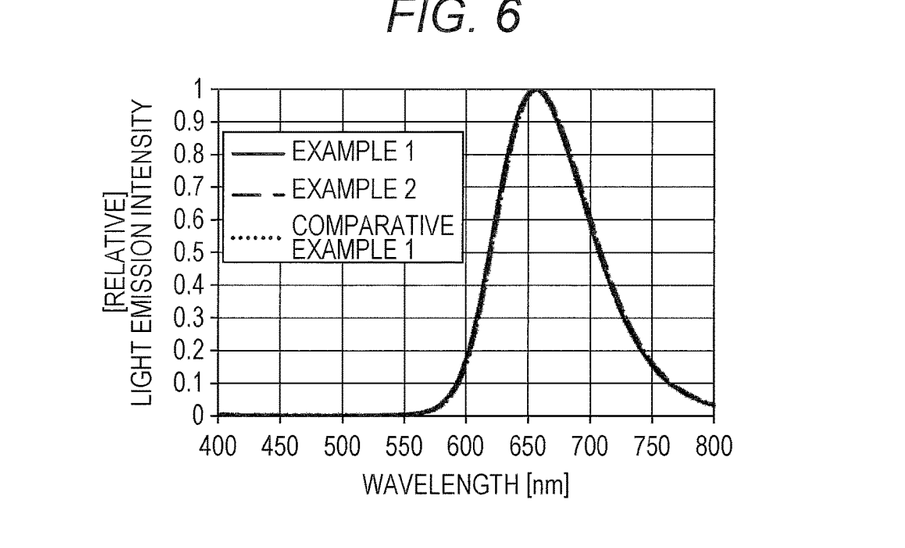
FIG. 6 is a schematic diagram illustrating light emission spectra of the light emitting devices according to Examples 1 and 2 and Comparative Example 1.
Figure 7:
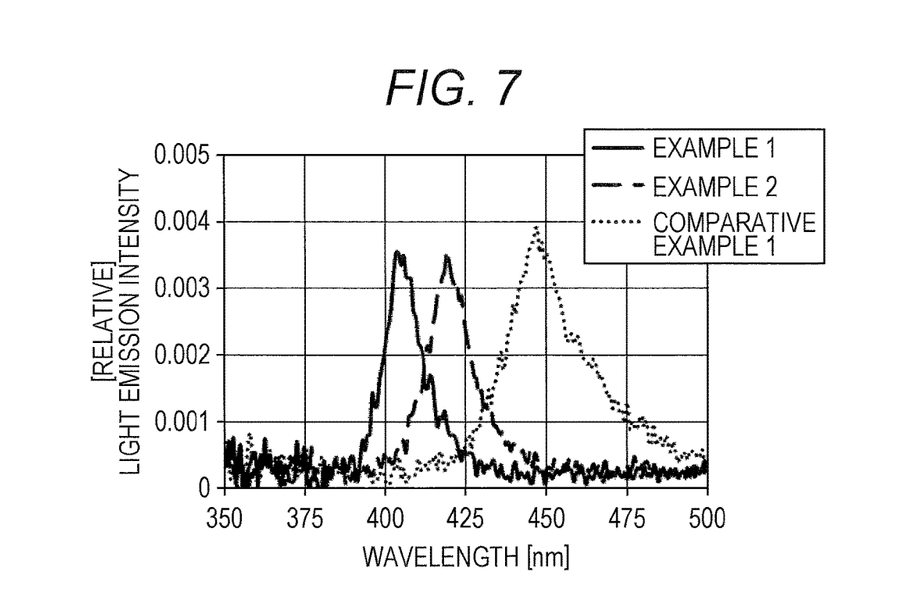
FIG. 7 is a schematic diagram illustrating the light emission spectra of the light emitting devices according to Examples 1 and 2 and Comparative Example 1.
Figure 8:
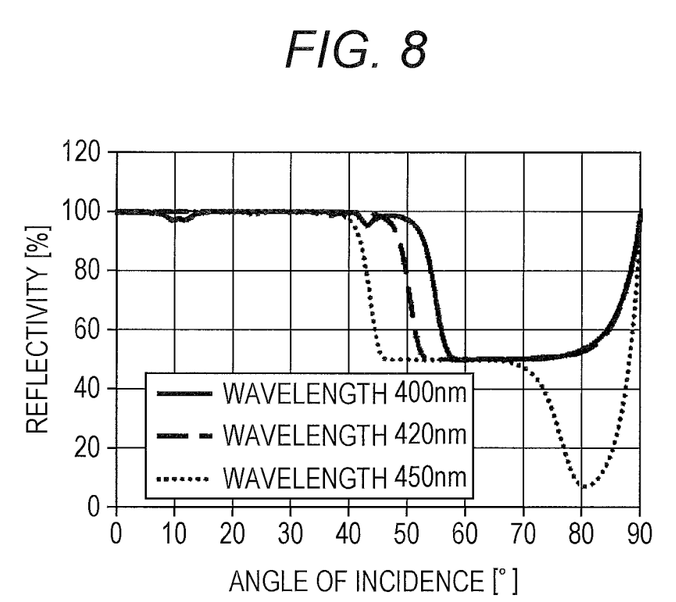
FIG. 8 is a schematic diagram illustrating reflectivity of first light emitted by a light emitting element at angles of incidence of the light to a reflecting film.
Figure 9:
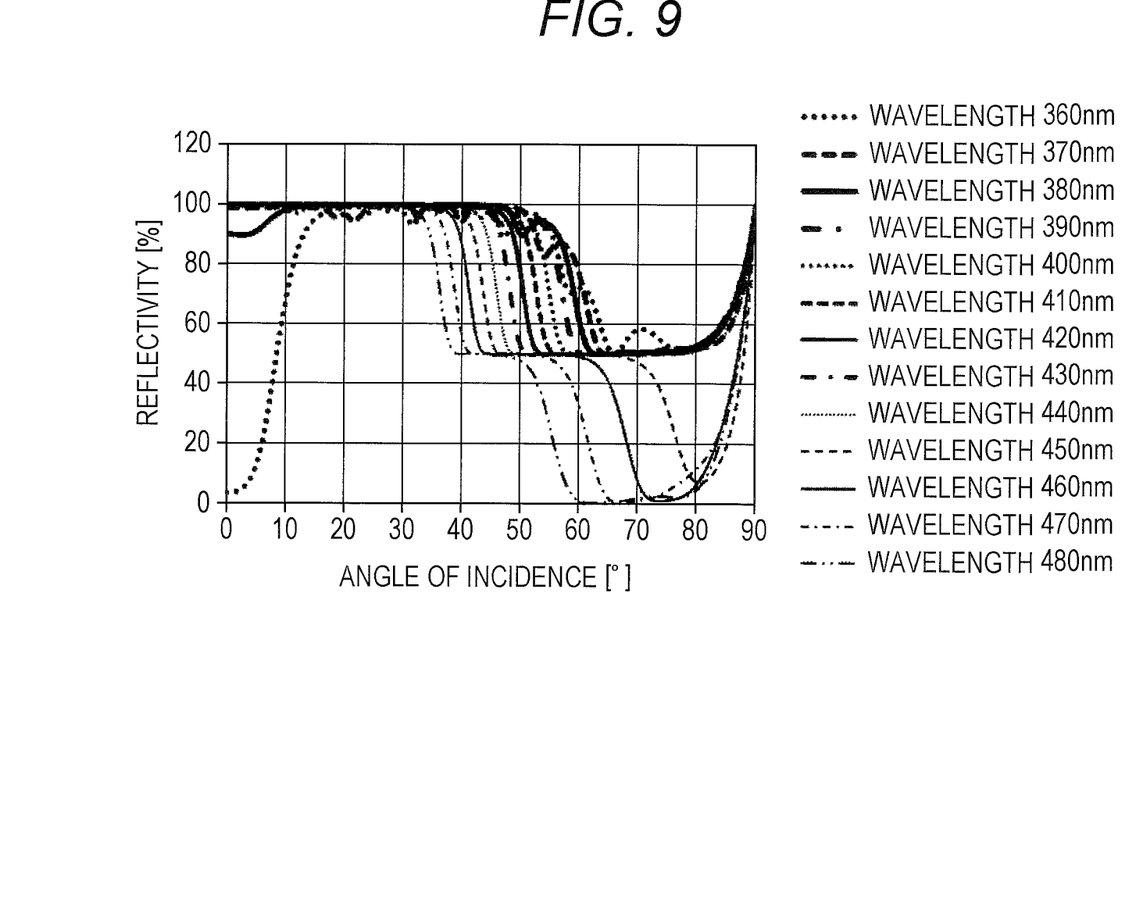
FIG. 9 is a schematic diagram illustrating the reflectivity of the first light emitted by the light emitting element at angles of incidence of the light to the reflecting film.

Hereinafter, examples are specifically described with reference to drawings. The present embodiments, however, are not limited to these examples. FIG. 3 is a schematic diagram illustrating reflectivity of the reflecting film for wavelengths of normal incident light (an angle of incidence of 0°) in the light emitting device according to Example 1. FIG. 3 is a simulation. FIG. 4 is a schematic diagram illustrating a shift of chromaticity coordinates x relative to directional angles in light emitting devices of Examples 1 and 2 and Comparative Example 1. FIG. 5 is a schematic diagram illustrating a shift of chromaticity coordinates y relative to directional angles in the light emitting devices of Examples 1 and 2 and Comparative Example 1. FIG. 6 is a schematic diagram illustrating light emission spectra of the light emitting devices according to Examples 1 and 2 and Comparative Example 1. FIG. 7 is a schematic diagram illustrating the light emission spectra of the light emitting devices according to Examples 1 and 2 and Comparative Example 1. FIG. 8 is a schematic diagram illustrating reflectivity of first light emitted by a light emitting element at angles of incidence of the light to a reflecting film. FIG. 9 is a schematic diagram illustrating the reflectivity of the first light emitted by the light emitting element at angles of incidence of the light to the reflecting film. FIG. 8 is an excerpt from FIG. 9.

The light emitting devices of Examples 1 and 2 and Comparative Example 1 were produced. Description is sometimes omitted for parts that overlap with the embodiments.

As the light emitting elements 20 used in the light emitting devices of Examples 1 and 2 and Comparative Example 1, nitride-based semiconductor light emitting elements were used that had a peak emission wavelength λp of about 403 nm, about 420 nm, and about 447 nm, respectively. As the light-transmissive member 50, a glass plate having a thickness of 150 µm was used. On the glass plate was formed the reflecting film 40 that is a dielectric multi-layer film (DBR reflecting film) designed to reflect light having a wavelength shorter than 550 nm and transmits light having a wavelength longer than 550 nm. Specifically, the dielectric multi-layer film was formed by alternately stacking the first dielectric layer 41 made from $Nb_2O_5$ and the second dielectric layer 42 made from $SiO_2$ on the light-transmissive member 50 through a sputtering method in an order of the second dielectric layer 42, the first dielectric layer 41, the second dielectric layer 42, and the first dielectric layer 41 in 15.5 cycles (a total of 31 layers).

The fluorescent material layer 30 was formed on the reflecting film 40 at a predetermined thickness, by depositing, through a printing method, a material obtained by mixing in a silicone resin (KJR-9201 manufactured by Shin-Etsu Chemical Co., Ltd.) particles of a CASN-based fluorescent material represented by $CaAlSiN_3$:Eu so as to give a predetermined weight %. The fluorescent material of the fluorescent material layer 30 that was used in Examples 1 and 2 and Comparative Example 1 had a peak emission wavelength of about 660 nm and an average particle size of 6.5 µm.

Then, the light-transmissive member 50 having the reflecting film 40 and the fluorescent material layer 30 formed thereon was divided into pieces and bonded with a silicone resin (KJR-9200 manufactured by Shin-Etsu Chemical Co., Ltd.) onto the light emitting element 20 mounted on the base 10 (NJSW172A manufactured by NICHIA CORPORATION). Further, a side surface of the light-transmissive member 50 except an upper surface of the light-transmissive member 50, the fluorescent material layer 30, the light emitting element 20, and the inner bottom surface 16 and the inner side surface 17 of the recess portion 15 of the base 10 were covered with the resin 70. As the resin 70, used was a silicone resin (KJR-9023N manufactured by Shin-Etsu Chemical Co., Ltd.) containing a light diffusing material. The resin 70 was injected between, for example, the inner side surface 17 of the recess portion 15 and the light emitting element 20, and the resin composition was heated at about 150° C. for 4 hours for curing.

Table 1 shows the light emission characteristics of the light emitting devices of Examples 1 and 2 and Comparative Example 1 that were produced as described above.

TABLE 1

| | LIGHT EMITTING ELEMENT Peak wavelength (nm) | FLUORESCENT MATERIAL LAYER | | REFLECTING FILM DBR | Evaluation of light emission characteristics | |
|---|---|---|---|---|---|---|
| | | Content of fluorescent material (weight %) | Thickness (μm) | | Hue x | Hue y |
| Example 1 | 403 | 65 | 50 | Provided | 0.686 | 0.312 |
| Example 2 | 420 | 65 | 50 | Provided | 0.688 | 0.310 |
| Comparative Example 1 | 447 | 65 | 50 | Provided | 0.687 | 0.307 |

All the light emitting devices of Examples 1 and 2 and Comparative Example 1 emit predetermined red light. FIGS. 4 and 5 respectively illustrate chromaticity distributions Δx and Δy at almost the same chromaticity point in Examples 1 and 2 and Comparative Example 1. Here, the chromaticity distributions Δx and Δy represent a shift of chromaticity coordinates relative to directional angles of the light emitting device, with the chromaticity coordinates in the front direction defined as reference chromaticity coordinates. In Comparative Example 1, both the chromaticity distributions Δx and Δy are shifted to a minus side by 0.01 or more at a directional angle of from 60° to 85°, and the chromaticity coordinates are shifted to a direction in which the blue color is strong. In comparison with Comparative Example 1, the shift of chromaticity coordinates is small at a directional angle of from 60° to 85° in Examples 1 and 2, and thus the chromaticity distributions are improved. Further, the visibility is lower in Examples 1 and 2 than in Comparative Example 1, so that the light emitting devices of Examples 1 and 2 are much less likely to give feeling of color shifting.

Further, as illustrated in FIG. 8, the reflectivity for wavelengths decreases up to about a half at around an angle of incidence of 60° and sharply decreases at around an angle of incidence of 80° only for a wavelength of 450 nm. Accordingly, the shift of the chromaticity distributions relative to directional angles is kept small in Examples 1 and 2, whereas the shift of chromaticity distributions increases along with an increase in the angle of incidence in Comparative Example 1. Furthermore, in the light emission spectra, the intensity of a peak wavelength of the light emitting element is weaker in Examples 1 and 2 than in Comparative Example 1. This fact indicates that the reflectivity of the DBR reflecting film depending on the angle of incidence is kept and the light emitted by the light emitting element is reflected in Examples 1 and 2.

INDUSTRIAL APPLICABILITY

The light emitting devices according to the present embodiments can be used in a wide range of fields, e.g., a general light, a vehicle light, a light for appreciation, a warning lamp, and an indicating lamp. For example, when a light emitting device used for a vehicle rear lamp, a vehicle brake lamp, or the like is configured by incorporating a light emitting diode that emits light from a near-ultraviolet range to a blue color range, for example, a nitride-based fluorescent material can be used.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting device comprising:
    a light emitting element having a light emitting surface from which the light emitting element is configured to emit a first light having a first peak emission wavelength in a wavelength range of 380 nm or longer and 430 nm or shorter;
    a light transform layer disposed on the light emitting surface of the light emitting element to transform the first light to a second light having a second peak wavelength longer than the first peak wavelength;
    a reflecting film provided on the light emitting surface via the light transform layer to reflect the first light and to transmit the second light; and
    a plate-shaped light-transmissive member provided on the reflecting film.

2. The light emitting device according to claim 1, wherein the reflecting film has a reflectivity of 90% or more with respect to a light having a wavelength of 380 nm or longer and 430 nm or shorter and an angle of incidence from 0° to 45°.

3. The light emitting device according to claim 1, wherein the reflecting film has a reflectivity of 90% or more with respect to a light having a wavelength of 380 nm or longer and 530 nm or shorter and an angle of incidence of 0°.

4. The light emitting device according to claim 1, wherein the first light has a relative intensity of 0.3 in a wavelength of 450 nm with respect to a maximum intensity in the first peak emission wavelength, the maximum intensity being defined as 1.

5. The light emitting device according to claim 1, wherein the light transform layer comprises a fluorescent material to be excited by the first light to emit the second light.

6. The light emitting device according to claim 5, wherein the fluorescent material has a peak emission wavelength in a wavelength range of 550 nm or longer and 780 nm or shorter.

7. The light emitting device according to claim 1, further comprising a base on which the light emitting element is disposed.

8. The light emitting device according to claim 1, further comprising:
    a base on which the light emitting element is disposed, wherein the base includes a recess portion including an inner bottom surface and an inner side surface,
    wherein the light emitting element is disposed on the inner bottom surface of the recess portion of the base,
    wherein a base material for the base is ceramics, and wherein a resin is disposed in the recess portion of the base such that the resin is in contact with the light emitting element and the plate-shaped light-transmissive member.

9. The light emitting device according to claim 8, wherein an uppermost surface of the recess portion of the base is positioned farther from the inner bottom surface of the recess portion of the base than a surface of the plate-shaped light-transmissive member.

10. The light emitting device according to claim 8, wherein the resin contains at least one light diffusing material selected from the group consisting of zirconium oxide, yttrium oxide, aluminum oxide, aluminum hydroxide, barium carbonate, barium sulfate, magnesium oxide, and magnesium carbonate.

11. The light emitting device according to claim 1, wherein chromaticity of light emitted by the light emitting device is in a range surrounded by a quadrangle formed by connecting four points (x=0.645, y=0.335), (x=0.665, y=0.335), (x=0.735, y=0.265), and (x=0.721, y=0.259) in an xy chromaticity coordinate system of a CIE1931 chromaticity diagram.

12. The light emitting device according to claim 5, wherein the fluorescent material is at least one fluorescent material selected from fluorescent materials $(Sr,Ca)AlSiN_3$:Eu, $CaAlSiN_3$:Eu, and $K_2SiF_6$:Mn or a combination of fluorescent materials selected from fluorescent materials $(Sr,Ca)AlSiN_3$:Eu, $CaAlSiN_3$:Eu, and $K_2SiF_6$:Mn.

13. A light emitting device comprising:
a light emitting element having a light emitting surface from which the light emitting element is configured to emit a first light having a first peak emission wavelength in a wavelength range of 380 nm or longer and 430 nm or shorter;
a light transform layer disposed on the light emitting surface of the light emitting element to transform the first light to a second light having a second peak wavelength longer than the first peak wavelength; and
a reflecting film provided on the light emitting surface via the light transform layer to reflect the first light and to transmit the second light,
wherein the light transform layer comprises a fluorescent material to be excited by the first light to emit the second light, and
wherein the fluorescent material layer includes a plurality of stacked layers, with a fluorescent material $CaAlSiN_3$:Eu layer disposed on a near side to the light emitting element and a fluorescent material $(Sr,Ca)AlSiN_3$:Eu layer disposed on a far side from the light emitting element.

14. The light emitting device according to claim 1, wherein the reflecting film is a dielectric multi-layer film.

15. A light emitting device comprising:
a light emitting element to emit a first light having a first peak emission wavelength in a wavelength range of 380 nm or longer and 430 nm or shorter, the light emitting element comprising:
a first semiconductor layer;
a second semiconductor layer stacked on the first semiconductor layer in a stacking direction; and
an active layer stacked between the first semiconductor layer and the second semiconductor layer in the stacking direction;
a light transform layer stacked on the light emitting element in the stacking direction to transform the first light to a second light having a second peak wavelength longer than the first peak wavelength;
a reflecting film stacked on the light transform layer in the stacking direction to reflect the first light and to transmit the second light; and
a plate-shaped light-transmissive member provided on the reflecting film.

16. The light emitting device according to claim 15, wherein the light transform layer comprises a fluorescent material to be excited by the first light to emit the second light.

17. The light emitting device according to claim 1, wherein the reflecting film has a reflectivity of 40% or more in a reflection spectrum of the reflecting film with respect to a light having a wavelength of 380 nm or longer and 430 nm or shorter and an angle of incidence from 0° to 85°.

18. The light emitting device according to claim 1, further comprising a resin in contact with a lateral surface of the plate-shaped light-transmissive member and a lateral surface of the light emitting element so as to expose an upper surface of the plate-shaped light-transmissive member from an upper surface of the resin.

19. The light emitting device according to claim 1,
wherein the light transform layer is a plate-shaped layer, and
further comprising an adhesive agent layer disposed directly in contact with and between the light emitting element and the light transform layer.

20. The light emitting device according to claim 1,
wherein the light-transmissive layer does not contain fluorescent material.

* * * * *